United States Patent
Kapoor et al.

(10) Patent No.: US 10,657,015 B2
(45) Date of Patent: May 19, 2020

(54) MEMORY SYSTEM

(71) Applicant: NXP B.V., Eindhoven (NL)

(72) Inventors: Ajay Kapoor, Eindhoven (NL); Jurgen Geerlings, Valkenswaard (NL)

(73) Assignee: NXP B.V., San Jose, CA (US)

( * ) Notice: Subject to any disclaimer, the term of this patent is extended or adjusted under 35 U.S.C. 154(b) by 163 days.

(21) Appl. No.: 15/906,485

(22) Filed: Feb. 27, 2018

(65) Prior Publication Data
US 2018/0276093 A1 Sep. 27, 2018

(30) Foreign Application Priority Data

Mar. 24, 2017 (EP) .................................. 17162775

(51) Int. Cl.
| | | |
|---|---|---|
| G06F 11/00 | (2006.01) | |
| G06F 11/20 | (2006.01) | |
| G06F 11/10 | (2006.01) | |
| G11C 29/52 | (2006.01) | |
| G11C 29/00 | (2006.01) | |
| G06F 12/02 | (2006.01) | |

(52) U.S. Cl.
CPC ...... *G06F 11/2094* (2013.01); *G06F 11/1068* (2013.01); *G06F 12/023* (2013.01); *G11C 29/52* (2013.01); *G11C 29/76* (2013.01); *G06F 2201/805* (2013.01); *G06F 2201/82* (2013.01)

(58) Field of Classification Search
CPC combination set(s) only.
See application file for complete search history.

(56) References Cited

U.S. PATENT DOCUMENTS

| 6,643,166 B1 | 11/2003 | Ting et al. | |
|---|---|---|---|
| 7,372,749 B2* | 5/2008 | Poechmueller | G11C 29/785 365/189.04 |
| 7,715,260 B1* | 5/2010 | Kuo | G11C 11/413 365/201 |
| 8,645,878 B1* | 2/2014 | Clark | G06F 17/505 716/51 |

(Continued)

FOREIGN PATENT DOCUMENTS

TW 200300260 A 5/2003

OTHER PUBLICATIONS

Kapoor, Ajay et al., "Enabling Low Leakage SRAM Memories at system level: A case study", 1st Intl. Workshop on Emerging Memory Solutions, Mar. 18, 2016, Dresden, Germany, Retrieved from the Internet: URL:https://kluedo.ub.uni-kl.de/files/4304/_FINAL_W07.11.3.pdf.

(Continued)

*Primary Examiner* — Amine Riad

(57) ABSTRACT

A memory system is disclosed, comprising a primary memory module, a secondary memory module, and a controller. The controller is configured to identify addresses in the primary memory module requiring correction, and is further configured to receive a memory access request identifying an address in the primary memory module. The controller is configured to determine whether the address is identified as requiring correction and, if it is not, to direct the memory access request to the primary memory module. If the address is identified as requiring correction, the controller is configured to direct the memory access request to the secondary memory module.

20 Claims, 5 Drawing Sheets

(56) References Cited

U.S. PATENT DOCUMENTS

| | | | | |
|---|---|---|---|---|
| 8,677,203 | B1* | 3/2014 | Shalvi | G06F 11/14 |
| | | | | 714/747 |
| 8,812,898 | B1* | 8/2014 | Lahon | G06F 11/10 |
| | | | | 714/4.2 |
| 9,123,436 | B2* | 9/2015 | Chiou | G06F 1/26 |
| 9,132,436 | B2* | 9/2015 | Liang | B05B 1/005 |
| 9,778,983 | B2 | 10/2017 | Engin et al. | |
| 2008/0117696 | A1 | 5/2008 | Chang et al. | |
| 2008/0229161 | A1* | 9/2008 | Lee | G11C 29/50 |
| | | | | 714/710 |
| 2009/0172283 | A1* | 7/2009 | Khellah | G11C 11/412 |
| | | | | 711/118 |
| 2010/0191990 | A1* | 7/2010 | Zhang | G06F 12/0864 |
| | | | | 713/320 |
| 2014/0126275 | A1* | 5/2014 | Khailany | G11C 5/148 |
| | | | | 365/154 |
| 2014/0250345 | A1 | 9/2014 | Lee et al. | |
| 2014/0269020 | A1* | 9/2014 | Song | G11C 11/4074 |
| | | | | 365/154 |
| 2015/0092477 | A1* | 4/2015 | Chiou | G11C 11/417 |
| | | | | 365/154 |
| 2015/0128007 | A1* | 5/2015 | Kim | G11C 29/52 |
| | | | | 714/763 |
| 2016/0011975 | A1* | 1/2016 | Ananthakrishnan | G06F 12/084 |
| | | | | 711/130 |

OTHER PUBLICATIONS

Ansari, Amin et al.; "Enabling Ultra Low Voltage System Operation by Tolerating On-Chip Cache Failures;" DOI: 10.1145/1094233.1594309; Proceedings of the 2009 International Symposium on Low Power Electronics and Design, 2009, San Fancisco, CA, USA, Aug. 19-21, 2009.

U.S. Appl. No. 14/820,436; Kapoor, A. et al.; "Integrated Circuit Device and Method for Applying Error Correction to SRAM Memory"; Filed Feb. 9, 2017.

Wilkerson Chris, et al.; "Trading Off Cache Capacity for Reliability to Enable Low Voltage Operation," Intel, University of Central Florida, downloaded Feb. 9, 2018 from https://blogs.intel.com/wp-content/mt-content/com/research/isca_final.pdf, 18 pages.

Wlkerson, Chris, et al.; Trading off Cache Capacity for Reliability to Enable Low Voltage Operation; DOI: 10.1109/ISCA.2008.22; International Symposium on Computer Architecture Jun. 21-25, 2008.

* cited by examiner

MEMORY SYSTEM

FIELD

The disclosure relates to a memory system incorporating a secondary memory for correcting errors in a primary memory.

BACKGROUND

Particular locations in memory modules can become error-prone, making data stored in them unreliable. For example, SRAM is commonly used as random access memory (RAM) or cache memory in microcontrollers and microprocessors. Advantages of SRAM include its low power consumption, particularly when inactive, and reliability. To reduce active and/or retention power it is advantageous to reduce the supply voltage. However, as the supply voltage reduces, the reliability of SRAM reduces. In addition, for successive technology nodes, where the feature size of integrated circuit components successively reduces, the operating voltage range of SRAM reduces. Having a sufficient voltage available to drive the SRAM circuitry reliably therefore becomes a serious challenge. This is particularly the case for devices with added security, which may require extra voltage room, for example to accommodate supply rail voltage sensors.

SUMMARY

In accordance with a first aspect of the present disclosure there is provided a memory system, comprising a primary memory module, a secondary memory module and a controller configured to identify addresses in the primary memory requiring correction, wherein the controller is further configured to: receive a memory access request identifying an address in the primary memory module; determine whether the address is identified as requiring correction; if the address is not identified as requiring correction, direct the memory access request to the primary memory module; and if the address is identified as requiring correction, direct the memory access request to the secondary memory module.

Addresses in the primary memory module that require correction may be addresses of locations, e.g. bits or words, in the primary memory module that are likely to cause errors in stored data. For example, data stored in those locations may be likely to degrade or become unreadable significantly faster than data stored in non-error-prone locations. The errors may occur during an active mode of the primary memory module and/or during a retention mode of the primary memory module. Addresses requiring correction may be error-prone addresses, for example addresses of locations which have failed a reliability test, e.g. a BIST or external test. Error-prone addresses may alternatively be addresses of error-prone data stored on the primary memory module, for example data containing bugs.

The primary memory module may comprise an SRAM module, a ROM module, or a module comprising another type of memory.

The memory system may comprise one or more further primary memory modules, and the controller may be configured to identify addresses requiring correction in each further primary module and to direct memory access requests as for the first memory module. The primary memory modules may comprise different types of memory, for example one primary memory module may be an SRAM module and another primary memory module may be a ROM module. Any reference herein to a memory system comprising a primary memory module may therefore also be construed as encompassing a system comprising a plurality of primary memory modules, with the controller configured to interact similarly with each primary memory module.

The system may comprise a plurality of secondary memory modules. Each secondary memory module may be associated with one or more primary memory modules.

The secondary storage module, external from the primary memory module, provides redundant capacity for the primary memory module. If errors are identified at certain addresses in the primary memory module, access requests directed towards those addresses can instead be re-directed to the secondary storage module. The access request may be a read or write request. The secondary memory module may be used when the primary memory module is operated at low voltages (or a lower than nominal voltage including guardbands for the used process technology), e.g. below 0.9V for 40 nm 6T SRAM design, to provide redundancy when the reliability of the primary memory module reduces. As a separate module, the secondary memory module may be easily scaled or enabled/disabled at a system level when the redundancy it provides is not required. Additionally, as a separate module, the secondary memory module may be retrofitted into an existing memory system that does not provide sufficient redundancy.

In some embodiments the controller may be configured to identify addresses in the primary memory module requiring correction by accessing an address table, the address table identifying addresses in the primary memory requiring correction. The controller may comprise the address table. The address table may be stored on a memory module, for example a non-volatile memory module. The address table may be stored in the primary or secondary memory modules. The table may be a look-up table (LUT).

In some embodiments the controller may be configured to scan the primary memory module to determine locations susceptible to errors; and add the locations to the address table. Scanning the primary memory module may comprise running a test, such as a built-in self-test (BIST) or other appropriate test-vectors to find unreliable, or error-prone, locations in active and/or retention modes of the primary memory module. Scanning may be performed at or below a target operating voltage of the memory module—i.e. the operating voltage appropriate to the system in which the memory module is or is to be incorporated into. Scanning may be performed at regular intervals, or each time the memory system is switched on.

In alternative embodiments the controller may be configured to access the address table, or other list of error-prone addresses, on an external storage medium, for example a non-volatile memory module. A memory test may be performed on the primary memory module by an external device. For example, the primary memory module may be scanned for error-prone locations upon manufacture, or only infrequently thereafter. The results of the scan may be stored in a non-volatile memory, for the controller to access later.

In embodiments where the controller is configured to identify addresses of locations requiring correction in an active mode of the primary memory module and locations requiring correction in a retention mode of the primary memory module, the controller may be configured to access two separate address tables: one for active mode, one for retention mode. Each address table may be built and updated using the processes described above.

In some embodiments, the controller may be configured to identify addresses in the primary memory requiring correction by identifying flags in the primary memory associated with addresses requiring correction. For example, each word in the primary memory may have a flag associated with it. Each flag may identify whether the word, or other location it is associated with, is error-prone.

In some embodiments, the capacity of the secondary memory module may be at least two or three orders of magnitude smaller than the capacity of the primary memory module.

One conventional way to limit errors and prevent the SRAM 'bottleneck' is to incorporate an error correction mechanism. However, commonly used techniques such as the SECDED (single error correction, double error detection) scheme for a typical 32 bit word requires approximately a 20% overhead in SRAM capacity. Such a large overhead is costly, and reduces the available storage space of the memory, and/or increases the physical size of the SRAM memory module and hence the IC into which it is integrated. In the case of the present disclosure, it has been realised that even when the operating voltage of the memory module is low, only a small proportion of bits are likely to fail. Thus, only a small additional capacity is required to provide a back-up in case of failure of bits or words of the memory module. This realisation allows a small, external secondary storage module to be used to provide sufficient redundant capacity for the primary memory module, alleviating the problems of conventional memory modules. The secondary storage module may comprise a different form of memory, for example a non-SRAM form of memory, for example a less costly and/or more rapid form of memory may be used.

In some embodiments the capacity of the secondary memory module may be adjustable. For example, the secondary memory module may be a designated part of a larger memory module. The capacity of the larger memory module designated as the secondary memory module may be adjusted. Such adjustments may be performed on a systems level. The redundant capacity of the memory system may thus be adjusted based on the particular requirements of the system into which the memory module is to be integrated, avoiding wasted memory in situations where redundancy is not required.

In some embodiments, the capacity of the secondary memory module may be determined based on a target operating voltage and/or retention voltage of the primary memory module. If the target operating/retention voltage is lower, a larger capacity may be required for the secondary memory module, due to the decreased reliability of SRAM at lower operating voltages. Use of "target operating voltage" herein should be construed to include a target retention voltage.

In some embodiments the read and/or write time of the memory of the secondary memory module is less than that of the memory of the primary memory module. For example, the secondary memory module may comprise flip-flop or latch elements. As the secondary module is external to the memory module, the secondary module does not need to comprise the same type of memory as the primary memory module. Instead, a higher speed memory may be used. The higher speed of the secondary storage module may compensate for the redundancy processing time, so that implementing the memory system of the present disclosure does not degrade the primary memory access time. Where an address table is used to identify locations requiring correction, the method may further comprise updating the address table to reflect an increased error rate.

In some embodiments the reliable operating voltage of the secondary memory module is lower than that of the primary memory module, i.e. the secondary memory module may be more reliable than the primary memory module at the minimum reliable operating voltage of the primary memory module. In other words, the error rate of the secondary memory module may be lower at a given voltage than the error rate of the primary module at the same given voltage. The secondary memory module may be more robust than the primary memory module. For example, if the primary memory module is SRAM, the secondary module may be based on digital logic based latches or a register file. Separate supply voltages for the primary and second memory modules may be used, with the voltage for the secondary memory module being higher to reduce the possibility of the secondary memory module failing. Error detection and correction (for example ECC) may be incorporated into the secondary memory module to improve its robustness.

In some embodiments, the primary memory module may comprise a ROM module, and the controller may be configured to identify addresses in the ROM module requiring correction. For example an address table may be used to redirect ROM accesses. This may allow bugs in a ROM to be fixed by redirecting access attempts to updated portions stored on other devices, rather than necessitating a ROM update, which can be difficult or impossible, especially when a device has already been deployed.

According to a second aspect of the disclosure there is provided an electronic device comprising: a power source; a processor; and a memory system according to any embodiment of the first aspect. The device may be a low-voltage device, for example a Bluetooth® low energy device. The power source may be a battery.

According to a third aspect of the disclosure there is provided a method of providing access to memory in a memory system, the method comprising: receiving a memory access request identifying an address in a primary memory module; determining whether the address is identified as requiring correction; if the address is not identified as requiring correction, directing the memory access request to the primary memory module; and if the address is identified as requiring correction, directing the memory access request to a secondary memory module.

In some embodiments determining whether the address is identified as requiring correction may comprise accessing an address table, the address table identifying addresses in the primary memory requiring correction.

In some embodiments, the method may further comprise: scanning the primary memory module to determine unreliable locations; and adding the unreliable locations to the address table.

In some embodiments, the method may further comprise: determining a target operating voltage of the primary memory module; determining a likely error rate of the primary memory module at the target operating voltage; determining a redundant capacity required based on the likely error rate of the primary memory module; and adjusting the capacity of the secondary memory module to match the redundant capacity. Determining a likely error rate of the primary memory module at the target operating voltage may comprise comparing the target operating voltage to a known or calculated voltage dependence of the bit error rate (BER) of memory of the type in the memory module.

According to a fourth aspect of the disclosure there is provided a computer program comprising instructions for causing a computer to perform the method according to the third aspect.

The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be embodied as a transient signal. Such a transient signal may be a network download, including an internet download.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
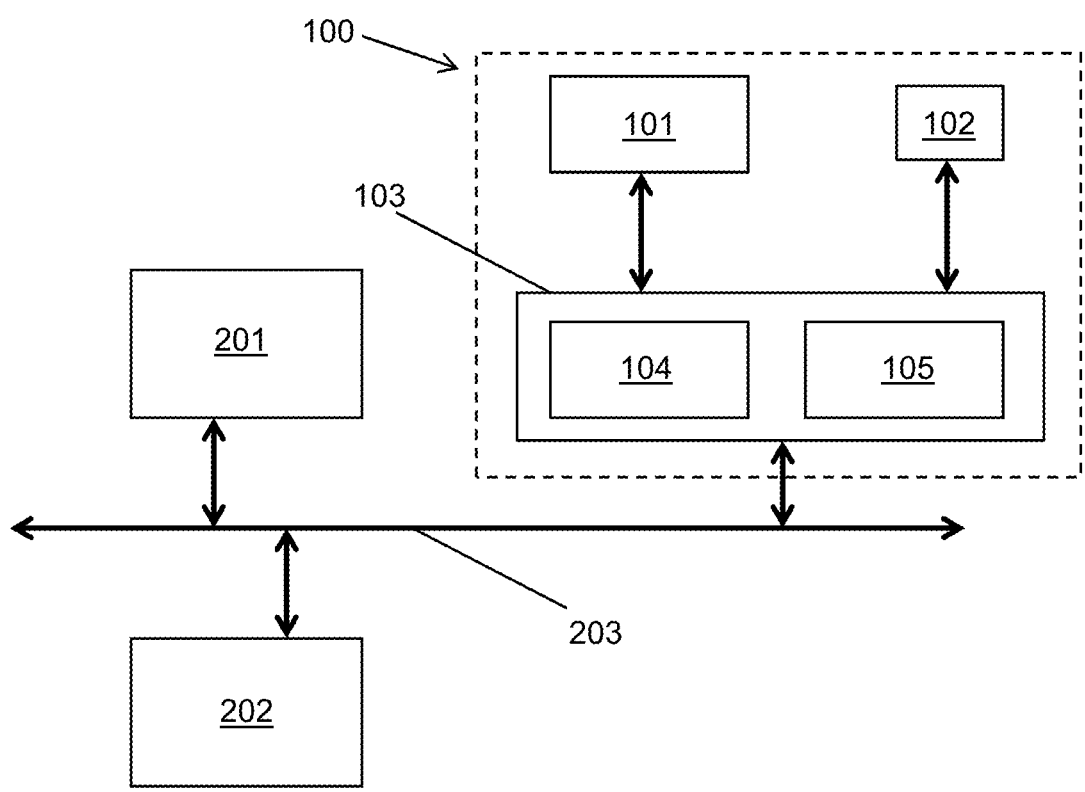
FIG. 1 is a schematic drawing of an example memory system incorporated into a computer system.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 shows an example embodiment of a memory system 100. memory module 100 comprises a primary memory module 101 (for example an SRAM module) and a secondary storage module 102. A controller 103 is connected to both the memory module 101 and the secondary storage module 103. The controller 103 comprises a memory controller 104 and a snooper module 105. The memory controller 104 and the snooper module 105 may be separate components, as shown in FIG. 1, or may be integrated together in a single controller.

The controller 103 may be connected to other components of an electronic system, and may receive memory access requests from the components of the system. An access request specifies an address in the memory module 101 that is to be accessed. In the illustrated embodiment, the controller 103 is connected to other components 201, 202 of a system by an Advanced High-performance Bus (AHB) 203. Components 201, 202 may be processors.

In the illustrated example, the snooper module 105 comprises an address table, listing locations of error-prone bits or words in the memory module 101. The address table may alternatively be stored in a memory module, such as a non-volatile memory module, and accessed by the snooper module 105. When a memory access request is received by the controller 103, the snooper 105 determines whether the access request is directed to an address listed in the address table. If the address is not listed in the table, the controller 103 directs the access request to the requested address in the memory module 101. If, on the other hand, the address is listed in the address table, the controller 103 directs the access request to the secondary storage module 102. Data can be written to or read from the secondary storage module 102 as if it were all stored in the primary memory module 101. The secondary storage module 102 provides redundancy in case bits or words of the primary memory module 101 become unreliable. The bits or words of the primary memory module may be considered error-prone if errors are likely to develop in them during an active mode of the primary memory module, and/or if errors are likely to develop during a retention mode of the memory module. The active mode may be the mode in which data can be read from or written to the primary memory. After reading/storing data, the primary memory module may be placed in a data retention mode. For example, the operating voltage may be reduced (to a retention voltage). For SRAM type memory in particular, reducing the operating voltage may reduce the reliability of the memory, and so identifying locations in the primary memory that are error-prone whilst in the retention mode made be particularly important.

Figure 2:
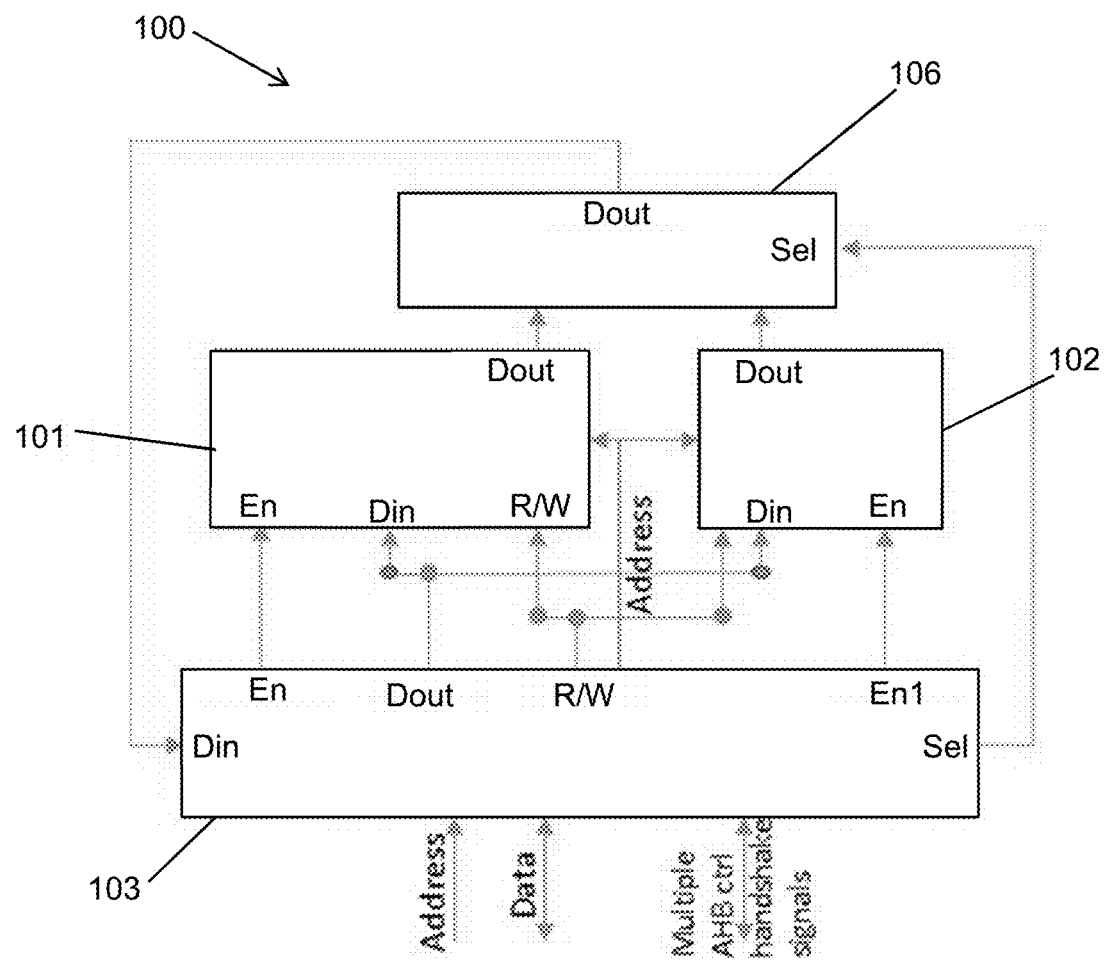
FIG. 2 is a schematic drawing of an alternative example embodiment of a memory system.

FIG. 2 shows a detailed view of an example embodiment of a memory system 100, illustrating various connections between the primary memory module 101, the secondary storage module 102, and the controller 103. In this embodiment, controller 104 and snooper module 105 of the controller 105 are integrated into the controller 103. FIG. 2 also shows a demultiplexer 106, configured to select a data output line Dout from either the primary memory module 101 or the secondary memory module 102 to connect to the controller 103. The selection is determined by a selection signal Sel received from the controller 103.

The capacity of the secondary storage module 102 is determined by the redundancy requirements of the primary memory module 101. This in turn depends upon the target operating voltage of the primary memory module 101, or the voltage scalability required. In the case of a scalable voltage, the target operating voltage should be understood to be the lowest voltage within the possible range of voltages. Lower voltages increase the likelihood of errors in the primary memory module 100, as shown in FIG. 3.

Figure 3:
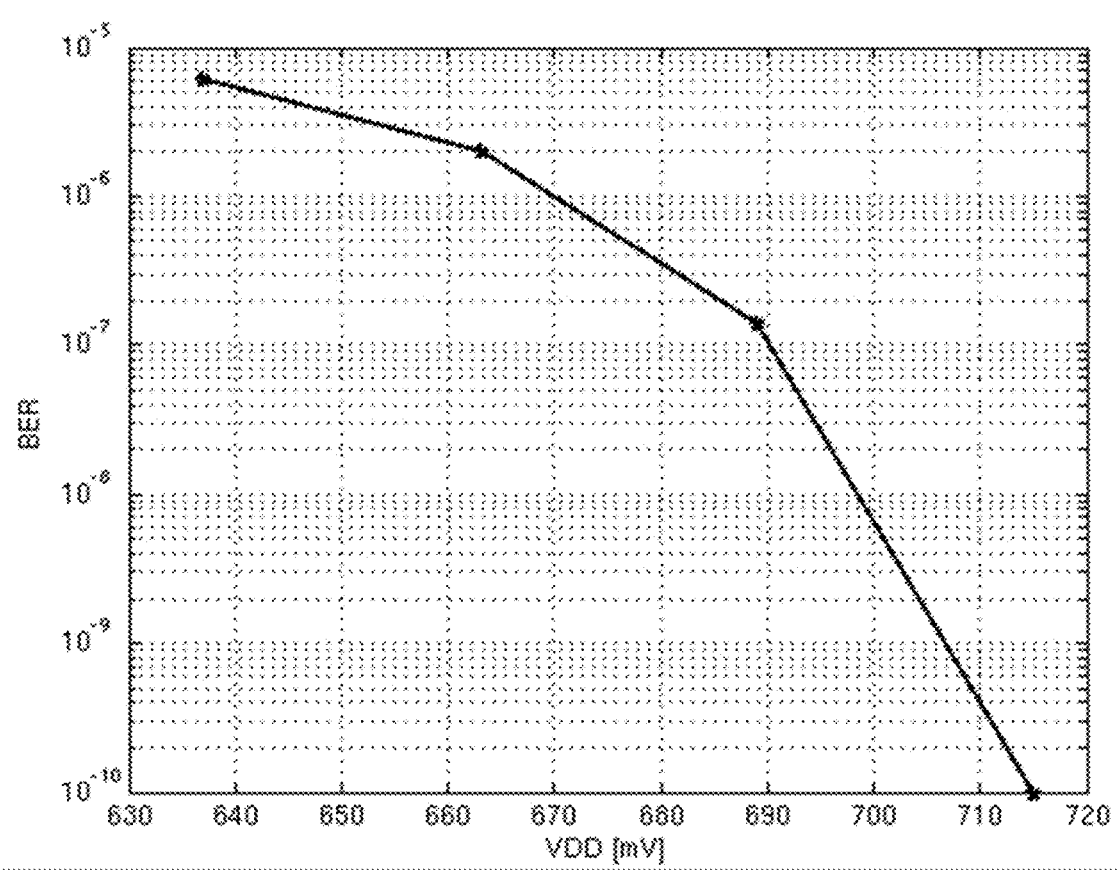
FIG. 3 is an illustrative plot of bit error rate (BER) as a function of voltage for a typical SRAM.

FIG. 3 shows the relationship between bit-error rate (BER) and operating voltage VDD for an example 40 nm SRAM. The BER increases by four orders of magnitude when the operating voltage is reduced from above 710 mV to below 660 mV. Thus, if a lower operating voltage is to be used, more redundancy must be provided. Based on the determined BER at the target operating voltage and the amount of SRAM in the primary memory module 101, the amount of redundant capacity required can be calculated. This redundant capacity is realised in the secondary storage module 102. The redundant capacity may for example be 1 word redundancy per 1000 words in the primary memory module 101, which would account for a BER of as high as $10^{-3}$. The capacity of the secondary storage module 102 may therefore be much smaller than the capacity of the primary memory module 101, for example over 1000 times smaller.

The capacity of the secondary storage module 102 may be chosen at manufacture of the memory system 100 to match an expected target operating voltage. Alternatively, the capacity of the secondary storage module 102 may be adjustable, for example at the system level. The secondary storage module 102 may be incorporated into a larger storage device. The capacity of that device designated as the secondary storage module 102 may be increased or decreased, for example in response to changes in the target operating voltage of the primary memory module 101. The part of the larger storage device not designated as the secondary storage module 102 may be used for other purposes, such as general storage. A computer program may be configured to determine the capacity of the secondary storage module 102 required at a target operating voltage of the primary memory module, and to adjust the capacity of the secondary storage module 102 accordingly.

The secondary storage module 102 may comprise a different form of memory to the memory module 101, such as a register file, RAM, or non-volatile memory. The secondary storage module 102 may comprise a higher speed form of memory than SRAM. In particular, the secondary storage module 102 may comprise a register file based on logic flip flop or latch elements. For example, for a redundancy of 1 word of 32 bits, 32 latch elements are required. Such a register file allows higher speed and lower voltage operation than conventional SRAM. The higher speed operation of the secondary memory module 102 reduces the impact of the redundancy processing on the SRAM access time.

Figure 4:
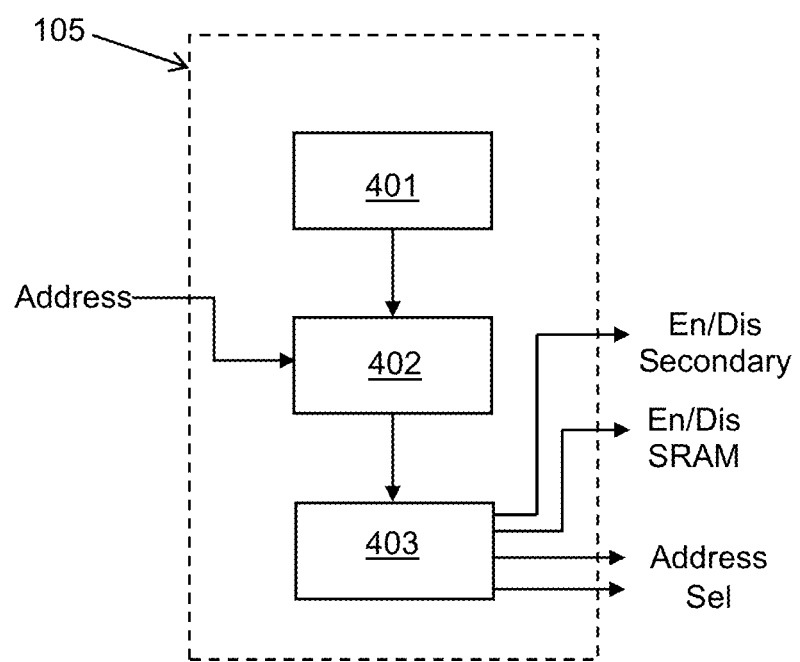
FIG. 4 is a schematic diagram of an example snooper module for a controller.

FIG. 4 shows a representation of the snooper logic used by snooper module 105 to process access requests. The snooper module 105 comprises a look-up table (LUT) 401, an address comparator 402, and an address generator 403. The input and output connections shown in FIG. 4 match the corresponding connections shown in FIG. 2. The LUT 401 comprises a list of addresses of unreliable, or error-prone, locations in the primary memory module 101. An incoming address, from an SRAM access request, is received by the address comparator 402. The address comparator 402 compares the incoming address to the entries in the LUT 401. If the incoming address maps into any of the LUT entry, the data is to be redirected to the secondary storage module 102. If the incoming address does not map into an LUT entry, the data is to be directed to the primary memory module 101. Control signals and an address are generated by the address generator 403 to direct the data to either the primary memory module 101 or the secondary storage module 102, as appropriate. The logic for addressing the elements of the secondary storage module 102 are similar to the address decoding logic (row-column mux/demux) of a conventional SRAM.

The LUT 401 may be generated by the controller 103, or may be loaded from an existing file, for example a file stored on non-volatile memory. The LUT 401 may be generated by running a built-in self test (GIST) or other test-vectors on the primary memory module 101 to determine the location of any error-prone words. The test may be run each time the memory system 100 is switched on, to generate a new LUT 401. Alternatively tests may have been run only at manufacture of the memory system 100, and a generated LUT stored in non-volatile memory (e.g. polyfuse or flash memory) for later access by the controller 103.

Figure 5:
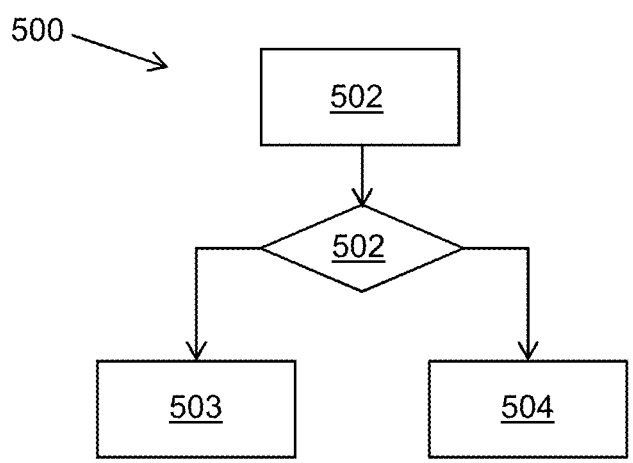
FIG. 5 is a schematic flow diagram for a method of providing access to a memory system.

FIG. 5 illustrates an example method 500 of providing access to memory in a memory system. At step 501, a memory access request identifying an address in a primary memory module is received. At step 502, it is determined whether the address is identified in an address table associated with the primary memory module. If the address is not identified in the address table, the method 500 proceeds to step 503, wherein the memory access request is directed to the primary memory module. If the address is identified in the address table, the method 500 instead proceeds to step 504, wherein the memory access request is directed to a secondary memory module.

From reading the present disclosure, other variations and modifications will be apparent to the skilled person. Such variations and modifications may involve equivalent and other features which are already known in the art of computer memory systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A memory system, comprising:
   a primary memory module;
   a secondary memory module; and
   a controller configured to identify addresses in the primary memory module requiring correction,
   wherein the controller is further configured to:
   receive a memory access request identifying an address in the primary memory module,
   determine whether the address is identified as requiring correction,
   if the address is not identified as requiring correction, direct the memory access request to the primary memory module, and
   if the address is identified as requiring correction, direct the memory access request to the secondary memory module,
   wherein the capacity of the secondary memory module is determined based on a target operating voltage of the primary memory module.

2. The memory system of claim 1, wherein the primary memory module is an SRAM module.

3. The memory system of claim 1, wherein the controller is configured to identify addresses in the primary memory by accessing an address table, the address table identifying addresses in the primary memory requiring correction.

4. The memory system of claim 3, wherein the controller is further configured to:
   scan the primary memory module to determine locations susceptible to errors; and
   add the locations to the address table.

5. The memory system of claim 1, wherein the controller is configured to identify addresses in the primary memory requiring correction by identifying flags in the primary memory associated with addresses requiring correction.

6. The memory system of claim 1, wherein the capacity of the secondary memory module is adjustable.

7. The memory system of claim 1, wherein:
the read time, write time, or both read and write times of the memory of the secondary memory module is less than that of the memory of the primary memory module; or
the reliable operating voltage of the secondary memory module is lower than that of the primary memory module.

8. The memory system of claim 1, wherein the capacity of the secondary memory module is at least two or three orders of magnitude smaller than the capacity of the primary memory module.

9. The memory system of claim 1, wherein the secondary memory module comprises latch elements.

10. A computer program comprising instructions for causing a computer to perform the method according to claim 1.

11. An electronic device comprising:
a power source;
a processor; and
a memory system according to claim 1.

12. A method of providing access to memory in a memory system, the method comprising:
receiving a memory access request identifying an address in a primary memory module;
determining whether the address is identified as requiring correction;
if the address is not identified as requiring correction, directing the memory access request to the primary memory module;
if the address is identified as requiring correction, directing the memory access request to a secondary memory module;
determining a target operating voltage of the primary memory module;
determining a likely error rate of the primary memory module at the target operating voltage;
determining a redundant capacity required based on the likely error rate of the primary memory module; and
adjusting the capacity of the secondary memory module to match the redundant capacity.

13. The method of claim 12, wherein determining whether the address is identified as requiring correction comprises accessing an address table, the address table identifying addresses in the primary memory requiring correction.

14. A memory system, comprising:
a primary memory module;
a secondary memory module; and
a controller configured to identify addresses in the primary memory module requiring correction,
wherein the controller is further configured to:
receive a memory access request identifying an address in the primary memory module,
determine whether the address is identified as requiring correction,
if the address is not identified as requiring correction, direct the memory access request to the primary memory module, and
if the address is identified as requiring correction, direct the memory access request to the secondary memory module,
wherein the capacity of the secondary memory module is determined based on a required redundant capacity, wherein the required redundant capacity is determined based on a likely error rate of the primary memory module at a target operating voltage.

15. The memory system of claim 14, wherein the primary memory module is an SRAM module.

16. The memory system of claim 14, wherein the controller is configured to identify addresses in the primary memory by accessing an address table, the address table identifying addresses in the primary memory requiring correction.

17. The memory system of claim 14, wherein the controller is configured to identify addresses in the primary memory requiring correction by identifying flags in the primary memory associated with addresses requiring correction.

18. The memory system of claim 14, wherein the capacity of the secondary memory module is adjustable.

19. The memory system of claim 14, wherein:
the read time, write time, or both read and write times of the memory of the secondary memory module is less than that of the memory of the primary memory module; or
the reliable operating voltage of the secondary memory module is lower than that of the primary memory module.

20. The memory system of claim 14, wherein the capacity of the secondary memory module is at least two or three orders of magnitude smaller than the capacity of the primary memory module.

* * * * *